US008207872B2

(12) United States Patent
Huang et al.

(10) Patent No.: US 8,207,872 B2
(45) Date of Patent: Jun. 26, 2012

(54) MECHANICAL KEYPAD WITH TOUCH PAD FUNCTION

(75) Inventors: Chin-Chun Huang, Taoyuan (TW); Yi-Hsiang Hsiao, Taoyuan (TW); Shih-Pu Yu, Taoyuan (TW)

(73) Assignee: Ichia Technologies, Inc., Hwa-Ya Tech. Park, Gueishan, Taoyuan (TW)

( * ) Notice: Subject to any disclaimer, the term of this patent is extended or adjusted under 35 U.S.C. 154(b) by 503 days.

(21) Appl. No.: 12/577,206

(22) Filed: Oct. 11, 2009

(65) Prior Publication Data

US 2010/0309030 A1 Dec. 9, 2010

(30) Foreign Application Priority Data

Jun. 4, 2009 (TW) ............................... 98118547 A

(51) Int. Cl.
*H03M 11/00* (2006.01)

(52) U.S. Cl. .............. 341/22; 341/32; 341/33; 345/168; 345/170; 345/173; 345/176; 200/5 A; 200/310; 200/313; 200/314

(58) Field of Classification Search .................... 341/22, 341/32, 33; 345/168–170, 173, 176; 200/5 A, 200/5 R, 314, 313, 310, 512, 517
See application file for complete search history.

(56) References Cited

U.S. PATENT DOCUMENTS

| | | | | |
|---|---|---|---|---|
| 6,180,895 | B1 * | 1/2001 | Hutchinson et al. | 200/5 A |
| 6,704,004 | B1 * | 3/2004 | Ostergård et al. | 345/170 |
| 6,871,978 | B2 * | 3/2005 | Chan et al. | 362/85 |
| 7,176,894 | B2 * | 2/2007 | Ostergård et al. | 345/168 |
| 7,335,843 | B2 * | 2/2008 | Chan et al. | 200/310 |
| 7,345,250 | B2 * | 3/2008 | Hakunti et al. | 200/5 A |
| 7,503,683 | B2 * | 3/2009 | Liu | 362/616 |
| 7,935,904 | B2 * | 5/2011 | Song | 200/310 |
| 7,944,437 | B2 * | 5/2011 | Imamura | 345/175 |
| 7,978,467 | B2 * | 7/2011 | Ichikawa | 361/679.54 |
| 8,022,324 | B2 * | 9/2011 | Liu | 200/314 |
| 2008/0192026 | A1 | 8/2008 | Mackey | |
| 2009/0002328 | A1 | 1/2009 | Ullrich | |
| 2009/0065335 | A1 | 3/2009 | Yao | |
| 2010/0219059 | A1 * | 9/2010 | Jung et al. | 200/5 A |
| 2011/0220477 | A1 * | 9/2011 | Chen | 200/314 |

FOREIGN PATENT DOCUMENTS

| | | |
|---|---|---|
| JP | 2008269950 A | 11/2008 |
| JP | 2008270000 | 11/2008 |

* cited by examiner

*Primary Examiner* — Linh Nguyen
(74) *Attorney, Agent, or Firm* — Winston Hsu; Scott Margo

(57) ABSTRACT

A mechanical keypad with touch panel function includes a key set including a plurality of keycaps and a keytop covering the keycaps, a backlight layer under the key set, a capacitive touch unit selectively disposed under several keycaps, an elastic layer including an elastomer and a plunger corresponding to the keycaps and disposed under the capacitive touch unit as well as a circuit board including metal domes and dome sheets corresponding to the keycaps. Each metal dome provides a mechanical feedback force so that the keycaps are able to be in indirect contact with the metal domes and the dome sheets by means of the plunger.

24 Claims, 7 Drawing Sheets

MECHANICAL KEYPAD WITH TOUCH PAD FUNCTION

BACKGROUND OF THE INVENTION

1. Field of the Invention

The present invention relates to a mechanical input device. In particular, the present invention relates to a human machine interface for use in electronic products, which is integrated with a mechanical keypad and with touch panel functions.

2. Description of the Prior Art

With the development and progress of technologies, many electronic apparatuses have input devices, in particular mobile ones, mobile phones or PDAs for example. There are keys in these electronic apparatuses to make the users more easily input all kinds of information such as short text messages or commands, or use all kinds of functions, for example to move the cursor.

A mechanical keypad is a common input device for use in the mobile electronic apparatuses. A mechanical keypad usually includes multiple keys. Each key represents one single or multiple pre-determined signals, such as letters or symbols so that the users may choose one or more for input. Although a mechanical keypad is good at inputting certain pre-determined signals quickly, such as for chatting or for drafting documents, and is very popular for this purpose, the mechanical keypad is however too weak to input these non-pre-determined signals because each key of the mechanical keypad can only represent one or a few pre-determined signals once the mechanical keypad is used for inputting non-pre-determined signals, such as for driving a cursor in a graphic-oriented system or for constructing abstract patterns, Chinese characters for example.

Another later-introduced input device is called a "touch pad." Compared with the mechanical keypad, there is usually no key or no raised-dot for visually impaired users in a touch pad. When being used, the touch pad detects and follows the motions of finger(s) of the users to generate corresponding results. Accordingly, the touch pad has achieved a huge success in operations based on motions such as for driving a cursor in a graphic-oriented system or for constructing abstract patterns. Nevertheless, the touch pad is less useful for inputting pre-determined signals. In addition, the know-how of conventional LCD touch pad is generally owned by foreign manufactures. On one hand, a specially designed pen is required for using the touch pad. On the other hand, the fabricating cost of the touch pad is too high but the life is too short.

In one of the published documents in the art, Japanese application 2008-270000 discloses an input device. FIG. 1 illustrates an explosive view of the prior art. The input device 1 includes multiple independent keys 7 and the element 9 is used for fixing the keys 7. The input device 1 also includes a sheet sensor 50*a* for sensing motions. However, the prior art does not disclose that the keycaps may be mutually connected. In addition, the prior art also lacks a backlight source as well as a light guide film (LGF) for the uniform distribution of light. As a result, this design is not good for all purposes.

Given the above, the applicants of the present invention fell the need and the inadequacy of the above-mentioned problems such as inputting pre-determined signals and performing motion operations conveniently at the same time for users in the light of the accumulated experiences in the field. The applicants of the present invention accordingly firmly believe that these problems must have room for improvement.

SUMMARY OF THE INVENTION

The inventors of the present invention propose an invention which is reasonably designed and able to solve the aforesaid problems. The input device of the present invention possesses both of the convenience of the mechanical keypad and the advantages of the touch pad. When applied in an electronic device, a mobile electronic device in particular, the input device of the present invention may provide the users with maximal convenience and utility.

The present invention first proposes a mechanical keypad with touch panel function, which includes a key set, a capacitive touch unit, an elastic layer, a backlight layer and a circuit board. The key set includes a plurality of keycaps and a keytop covering the keycaps. The capacitive touch unit is selectively disposed under some of the keycaps in the key set and includes a plurality of openings to accommodate the several keycaps. The elastic layer is disposed under the capacitive touch unit and includes an elastomer and a plurality of plungers which correspond to the multiple keycaps. The backlight layer includes a plurality of openings to accommodate the keycaps. The circuit board is disposed under the backlight layer and includes a plurality of metal domes which correspond to the keycaps as well as a plurality of dome sheets which correspond to the metal domes. Each one of the metal domes provides a mechanical feedback force so that the multiple keycaps are capable of being in indirect contact with the metal domes and with the dome sheets by means of the plungers.

The present invention next proposes a mechanical keypad with touch panel function, which includes a key set, a backlight layer, a capacitive touch unit, an elastic layer, and a circuit board. The key set includes a plurality of mutually connecting keycaps and a keytop covering the mutually connecting keycaps. The backlight layer is disposed under the key set. The capacitive touch unit is disposed under the backlight layer. The elastic layer is disposed under the capacitive touch unit and includes an elastomer and a plurality of plungers which corresponds to the keycaps. The circuit board includes a plurality of metal domes which correspond to the multiple plungers as well as a plurality of dome sheets which correspond to the multiple metal domes. Each one of the metal dome provides a mechanical feedback force so that the keycaps are capable of being in indirect contact with the metal domes and with the dome sheets by means of the plungers.

The present invention again proposes a mechanical keypad with touch panel function, which includes a key set, a backlight layer, a capacitive touch unit, an elastic layer, and a circuit board. The key set includes a plurality of mutually connecting keycaps and a keytop for supporting the mutually connecting keycaps. The backlight layer is disposed under the key set. The capacitive touch unit is disposed under the backlight layer. The elastic layer is disposed under the capacitive touch unit and includes an elastomer and a plurality of plungers which correspond to the multiple keycaps. The circuit board includes a plurality of metal domes which corresponds to the multiple plungers as well as a plurality of dome sheets which corresponds to the multiple metal domes. Each one of the metal dome provides a mechanical feedback force so that the keycaps are capable of being in indirect contact with the metal domes and with the dome sheets by means of the plungers.

These and other objectives of the present invention will no doubt become obvious to those of ordinary skill in the art after reading the following detailed description of the preferred embodiment that is illustrated in the various figures and drawings.

DETAILED DESCRIPTION

The input device of the present invention not only has the convenience of the mechanical keypad for inputting pre-determined signals but also has the advantages of the touch pad based on motions for driving a cursor or for constructing abstract patterns. When applied in an electronic device, a mobile electronic device in particular, the input device of the present invention may provide the users with maximal convenience and utility.

The input device of the present invention may have various embodiments. The descriptions and technical contents of the various embodiments of the present invention will be illustrated along with the drawings.

Figure 1:
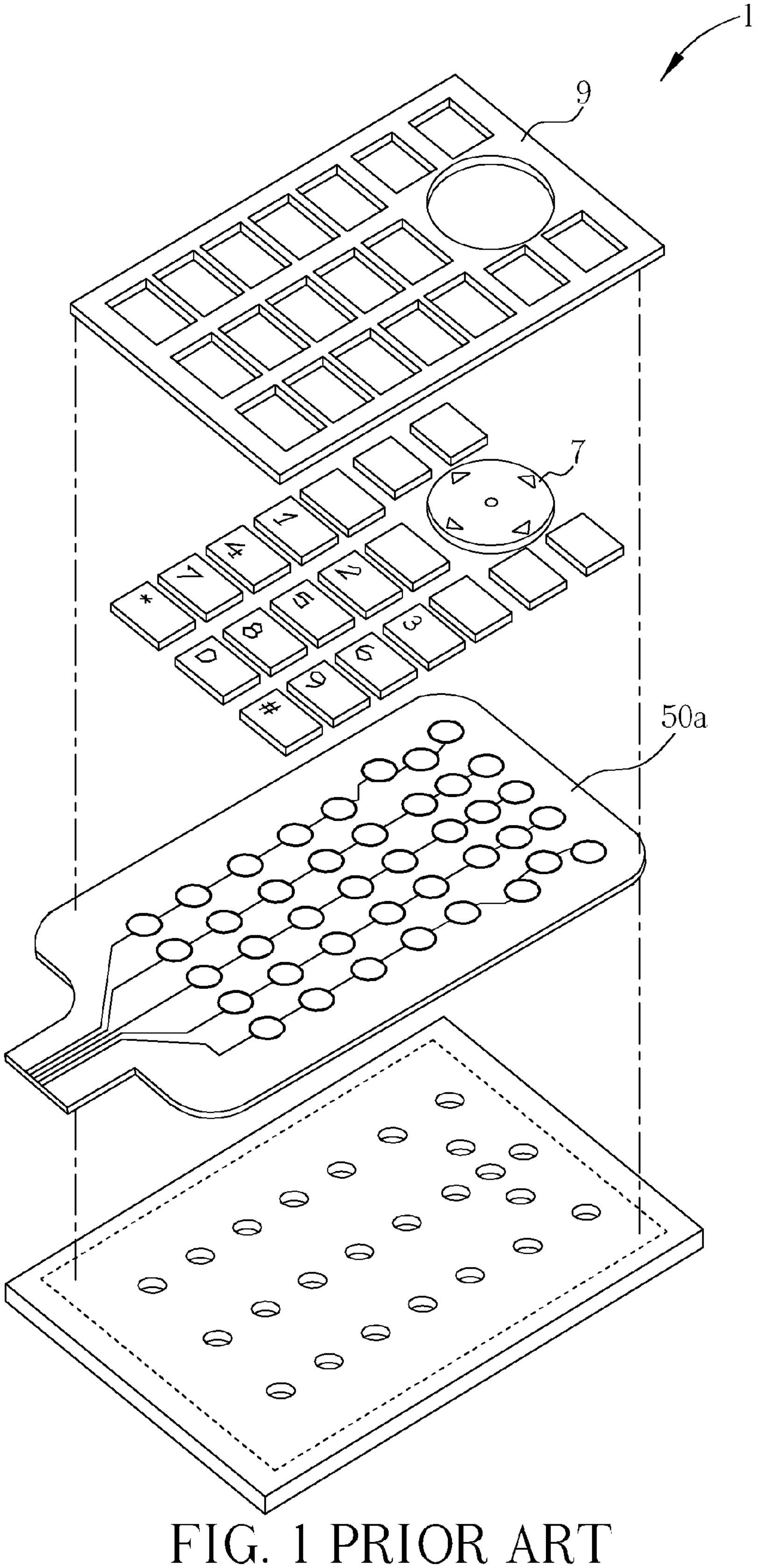
FIG. 1 PRIOR ART
FIG. 1 illustrates an explosive view of the prior art.
Figure 2A:
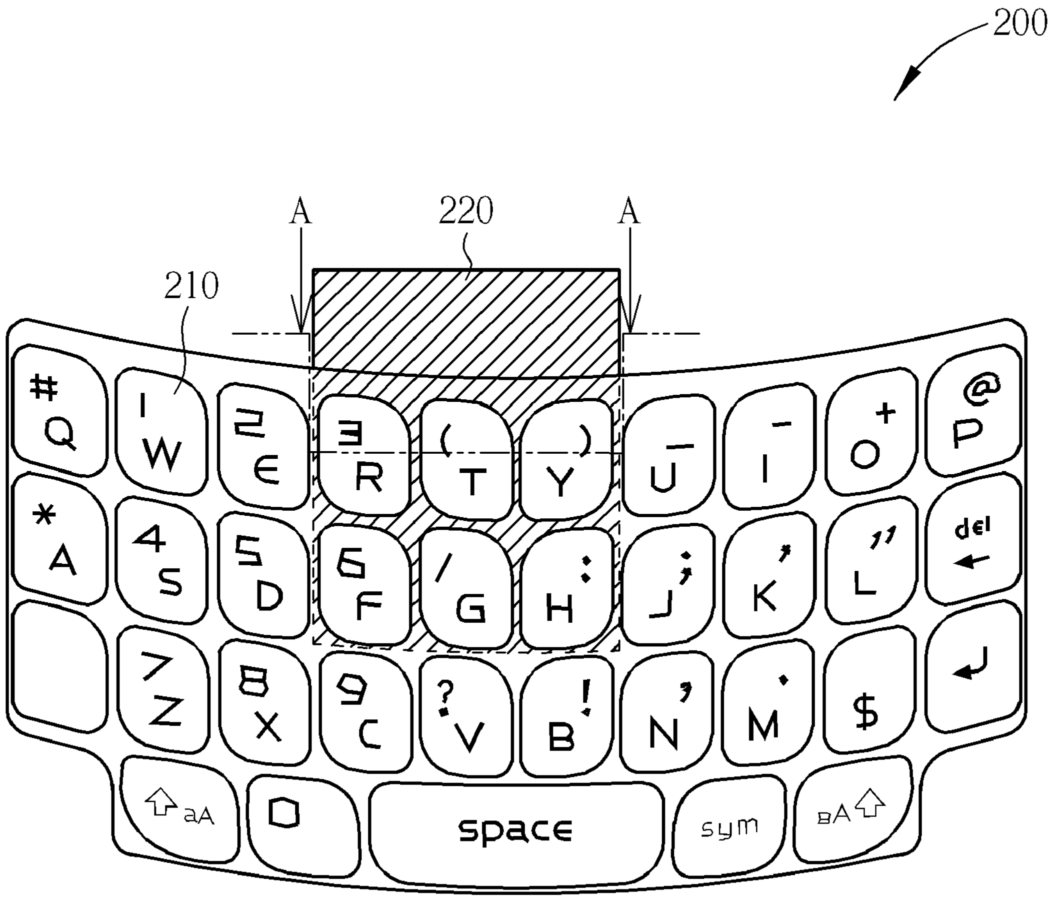
FIG. 2A illustrates a top view of the first embodiment of the mechanical keypad with touch panel function of the present invention.
Figure 2B:
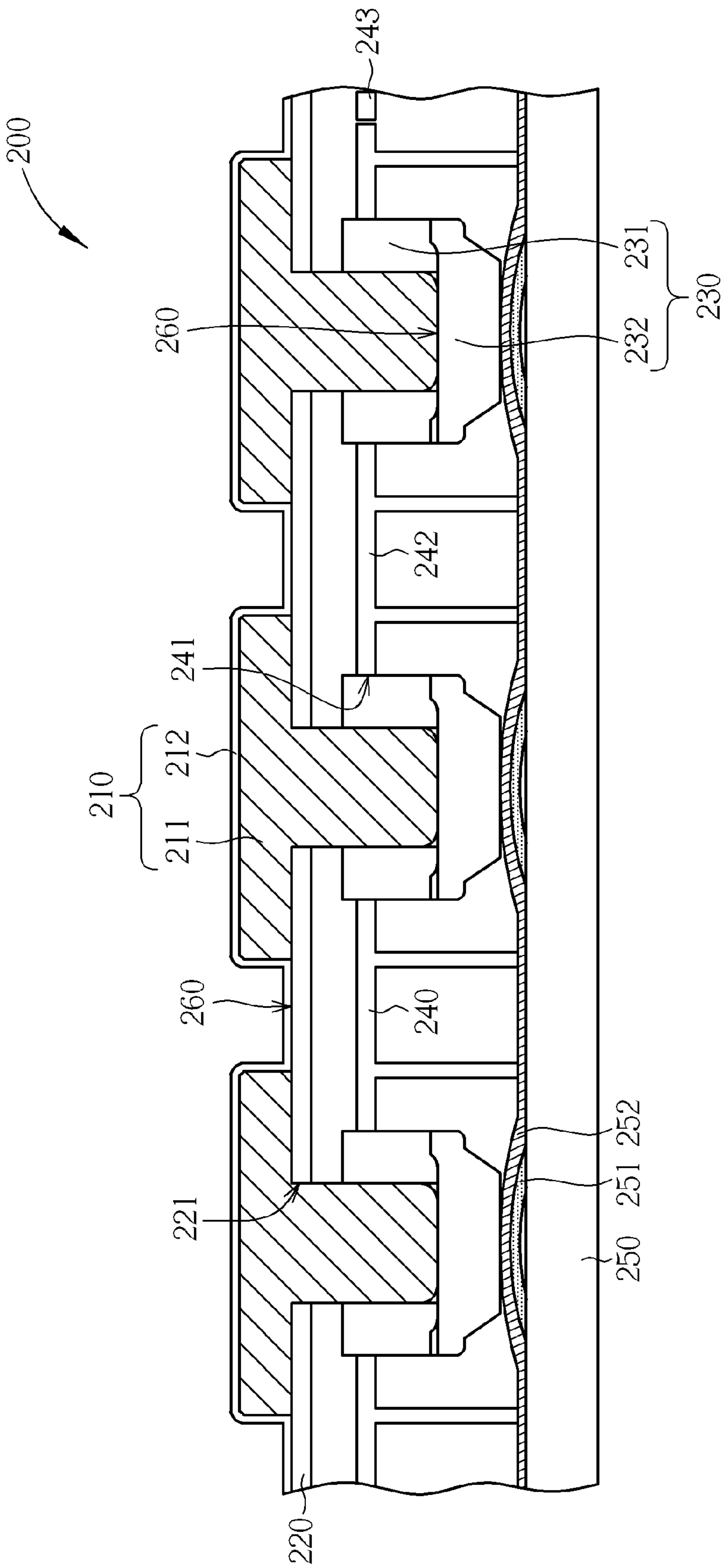
FIG. 2B illustrates a cross-sectional view along line A-A in FIG. 2A.

In one aspect of the present invention, a mechanical keypad 200 with touch panel function is provided. Please refer to FIG. 2A, illustrating a top view of a first embodiment of the mechanical keypad with touch panel function of the present invention. FIG. 2B illustrates a sectional view along line A-A' in FIG. 2A. The mechanical keypad 200 with touch panel function of the present invention includes a key set 210, a capacitive touch unit 220, an elastic layer 230, a backlight layer 240 and a circuit board 250. The key set 210 includes a plurality of keycaps 211, mutually independent for example, and a keytop 212 which entirely covers the keycaps 211. The keycaps 211 are usually made of polymers, such as plastics or silicone. For example, the keycaps 211 may have a section view of T shape.

The keytop 212 may be shaped by heating and molding, and the keycaps 211 may be shaped by plastic injection. In addition, the keytop 212 entirely covers all of the keycaps 211. The keytop 212 may be made of materials such as polycarbonates (PC) or polyethylene terephthalate (PET). The keytop 212 disposed on each one of the keycaps 211 may include for example a specific print pattern (not shown) such as characters or symbols to correspondingly mark the functions of each key.

The capacitive touch unit 220 is selectively disposed under several keycaps 211 in the key set 210 for detecting the corresponding motions which are caused by the movement of the finger (s) (not shown) of users. The term 'selectively' means that the capacitive touch unit 220 of the present invention may be optionally only disposed under several connecting keycaps 211 to form a touch region. Or, the capacitive touch unit 220 of the present invention may be optionally disposed under major connecting keycaps 211 to form a touch region. In such a way, users are able to touch the touch region which is collectively formed of the keycaps 211 of the capacitive touch unit 220 to command motion operations.

The capacitive touch unit 220 may be for example a capacitive touch pad. One feature of the first embodiment of the mechanical keypad with touch panel function of the present invention resides in that the capacitive touch unit 220 of the mechanical keypad 200 with touch panel function includes a plurality of openings 221. A plurality of openings 221 correspond to multiple keycaps 211 in order to accommodate multiple keycaps 211 so that the multiple keycaps 211 in the touch region may respectively pass through the openings 221 of the capacitive touch unit 220 to substantially make contact with an underlying elastic device to enhance an operational mechanical feedback force. Besides, an adhesive 260 may be used to respectively fix the keytop 212 and the capacitive touch unit 220.

Disposed under the capacitive touch unit 220 is an elastic layer 230 to provide users with touch feel. The elastic layer 230 may include an elastomer 231 and a plurality of plungers 232 which correspond to the multiple keycaps 211. The elastomer 231 may be formed of silicon and/or rubber.

The mechanical keypad 200 with touch panel function of the present invention additionally includes a backlight layer 240 to facilitate users to use the mechanical keypad 200 in the absence of a sufficient exterior illumination. Another feature of the first embodiment of the mechanical keypad with touch panel function of the present invention resides in that the backlight layer 240 of the mechanical keypad 200 with touch panel function of the present invention includes a plurality of openings 241. Each opening 241 corresponds to the keycap 211 which passes through the capacitive touch unit 220 in order to accommodate the multiple keycaps 211 so that the multiple keycaps 211 continue to pass through the backlight layer 240 after passing through the capacitive touch unit 220.

The backlight layer 240 may include a light guide film 242 (LGF) and at least one LED 243. The light guide film 242 may be formed of a polyurethane, polycarbonate, silicon, polymethacrylate and/or PET. Similarly, the light guide film 242 also includes a plurality of openings 241 to accommodate the multiple keycaps 211. The number and the location of the LED 243 are optional, for example to be located at a corner or centrally.

The circuit board 250 which is disposed under the backlight layer 240 includes a plurality of metal domes 251 which correspond to the multiple keycaps 211, as well as a plurality of dome sheets 252 which correspond to the metal domes 251. The function of the dome sheets 252 resides in adhering the metal domes 251 and the circuit board 250. The circuit board 250 may be a print circuit board, such as a flexible print circuit board, to generate a specific electronic signal when being pressed.

Each metal dome 251 and each dome sheet 252 which correspond to the keycap 211 are slightly bulged. Such bulge provides users with a mechanical feedback force when any one of the keycap 211 is pressed so that the common expectations by users are met. As described earlier, the multiple keycaps 211 pass through the capacitive touch unit 220 and the backlight layer 240. So the keycaps 211 are in direct contact with the plungers 232. The keycaps 211 are in indirect contact with the metal domes 251 and dome sheets 252 through the plungers 232 to positively provide users with a mechanical feedback force when any one of the keycap 211 is pressed by users.

In the first embodiment of the present invention, the mechanical keypad 200 with touch panel function may provide scrolling of a scroll bar and tactility of a sensor keypad . . . etc. On one hand, the scroll bar is better at preventing ESD damages. On the other hand, a touch control is more sensitive than a navigation key. Besides, in the first embodiment of the present invention, the thickness of the mechanical keypad 200 with touch panel function may be set to be within the range which is sensible by the capacitive touch unit 220, to be a thicker product.

Figure 3:
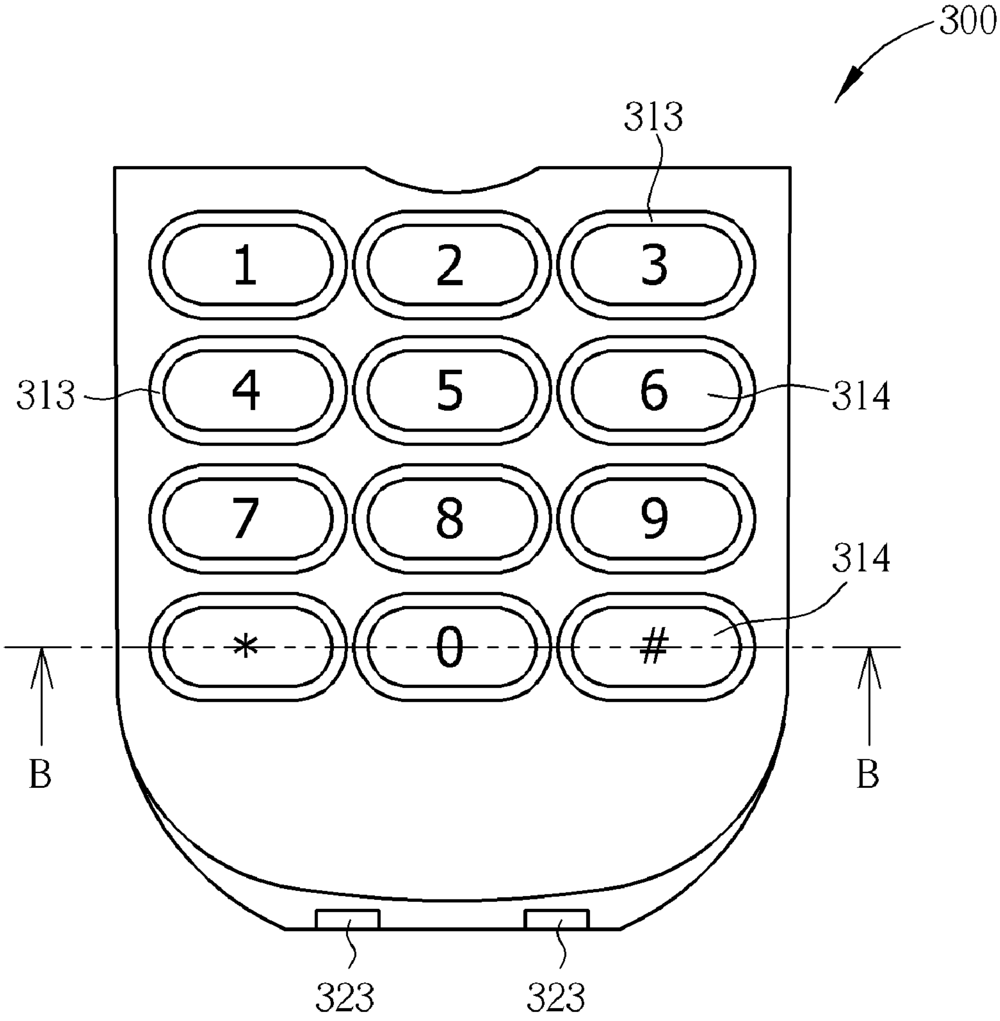
FIG. 3, illustrates a top view of the second embodiment of the mechanical keypad with touch panel function of the present invention.
Figure 4:
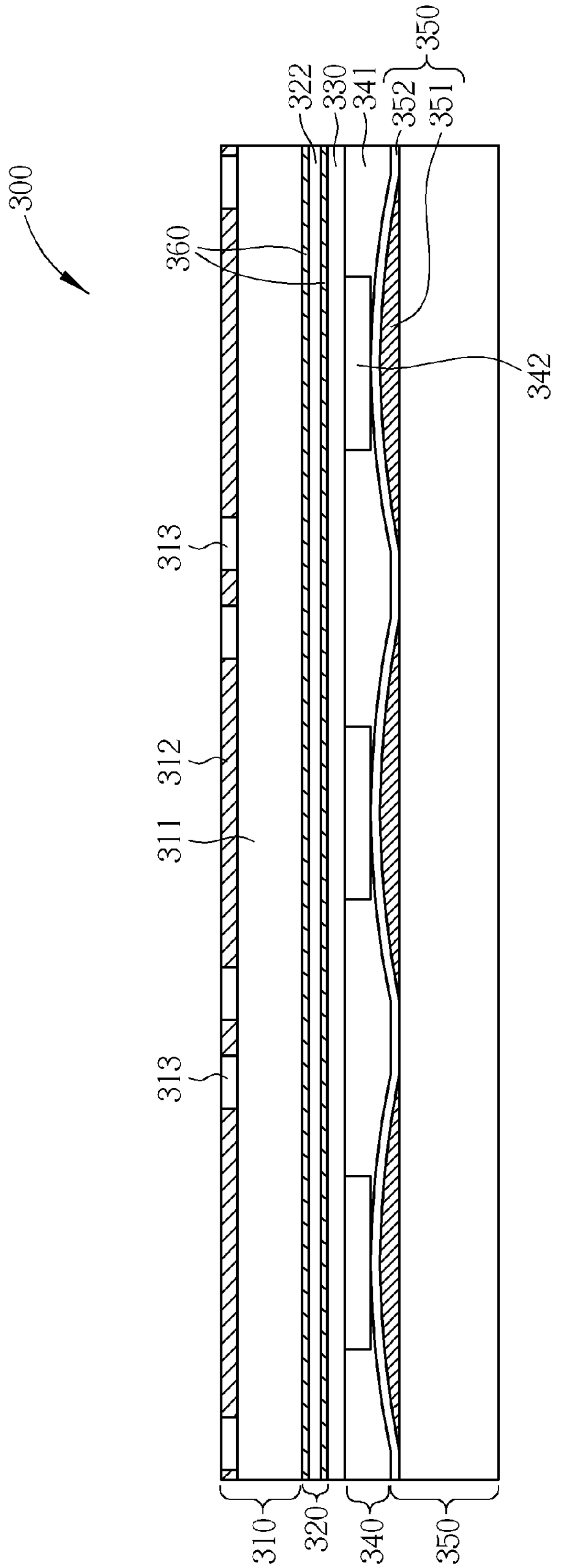
FIG. 4 illustrates a cross-sectional view along line B-B in FIG. 3.

In a second aspect of the present invention, another mechanical keypad 300 with touch panel function is provided. Please refer to FIG. 3, illustrating a top view of a second embodiment of the mechanical keypad with touch panel function of the present invention. FIG. 4 illustrates a cross-sectional view along line B-B in FIG. 3. Please refer to FIG. 4, the mechanical keypad 300 with touch panel function of the present invention includes a key set 310, a backlight layer 320, a capacitive touch unit 330, an elastic layer 340, and a circuit board 350. The key set 310 includes a plurality of mutually connecting keycaps 311 and a keytop 312 which entirely covers the mutually connecting keycaps 311. The mutually connecting keycaps 311 are usually made of polymers, such as a UV-curable resin. Each keycap 311 may be divided by a shallow trench 313. The keytop 312 entirely covers all of the keycaps 311. The keytop 312 may be made of materials such as PC or PET. The keytop 312 disposed on each one of the keycaps 311 may include a specific print pattern 314 such as characters or symbols to correspondingly mark the functions of each key.

As shown in FIG. 3, the mechanical keypad 300 with touch panel function of the present invention further includes a backlight layer 320 which is disposed under the key set 310 to facilitate users using the mechanical keypad 300 in the absence of a sufficient exterior illumination. The backlight layer 320 may include a light guide film 322 (LGF) and at least one LED 323. The light guide film 322 may be formed of a polyurethane, polycarbonate, silicon, polymethacrylate and/or PET in order to uniformly distribute the light. The number and the location of the LED 323 are optional, for example to be located at a corner or centrally.

The capacitive touch unit 330 is disposed under the backlight layer 320 for detecting the corresponding motions which are caused by the movement of the finger (s) (not shown) of users. The capacitive touch unit 330 may be for example a capacitive touch pad. Disposed under the capacitive touch unit 330 is an elastic layer 340 to provide users with touch feel. The elastic layer 340 may include an elastomer 341 and a plurality of plungers 342 which correspond to the multiple keycaps 311. The elastomer 341 may be formed of silicon and/or rubber.

The circuit board 350 disposed under the backlight layer 320 includes a plurality of metal domes 351 which correspond to the multiple keycaps 311, as well as a plurality of dome sheets 352 which correspond to the metal domes 351. The function of the dome sheets 352 is useful for adhering the metal domes 351 and the circuit board 350. The circuit board 350 may be a print circuit board, such as a flexible print circuit board, to generate a specific electronic signal when being pressed.

Each metal dome 351 and each dome sheet 352 which correspond to the multiple keycaps 311 are slightly bulged. Such bulge provides users with a mechanical feedback force when any one of the keycap 311 is pressed so that the common expectations by users are met. The keycap 311 are in indirect contact with the metal domes 351 and dome sheets 352 through the plungers 342 to positively provide users with a mechanical feedback force when any one of the keycap 311 is pressed by users.

In the second embodiment of the present invention, an adhesive 360 or a duct tape may be used to respectively fix the layers, such as keycaps 311, the backlight layer 320 and the capacitive touch unit 330. One feature of the second embodiment of the mechanical keypad with touch panel function of the present invention resides in that the thickness of the mechanical keypad 300 with touch panel function may be relatively small. For example, the distance of the keytop 312 to the capacitive touch unit 330 may be less than 2 mm so that the capacitive touch unit 330 is more sensitive to the operations of users. Under the combination of the touch mode and the key mode, various type of input methods may be carried out, for example a dialing mode, a writing mode by means of a finger tip to write letters or Chinese characters, or a picture browsing mode to drag, choose, to enlarge or shrink a picture.

Figure 5:
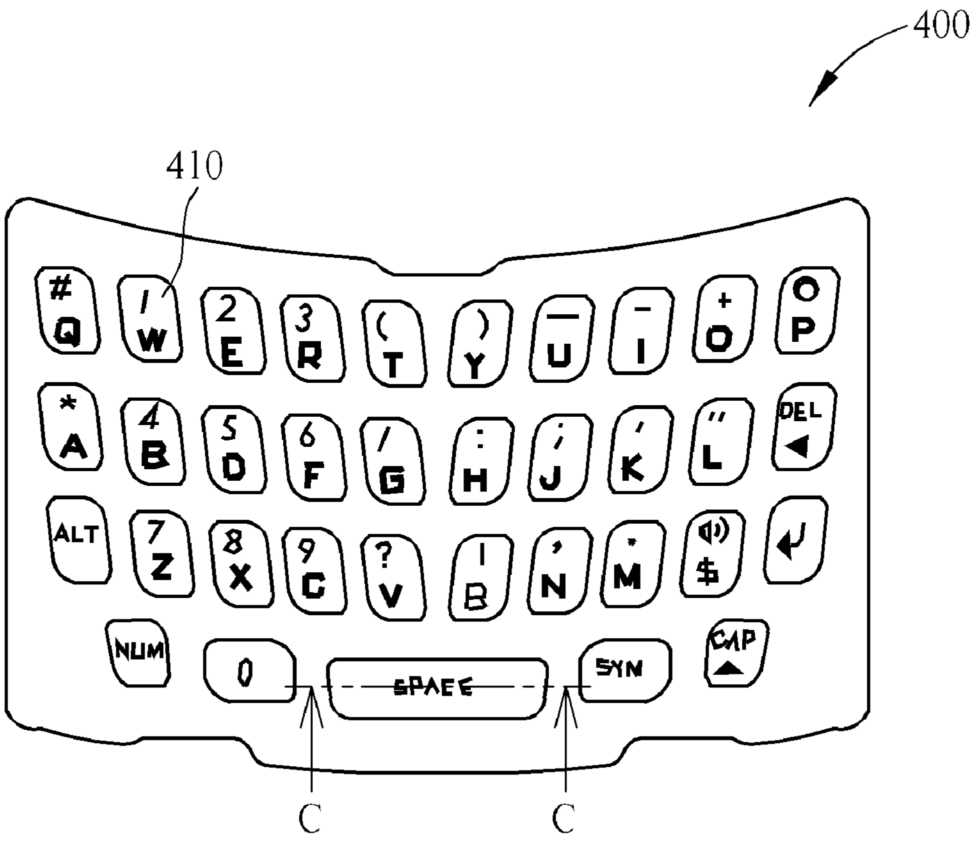
FIG. 5 illustrates a top view of the third embodiment of the mechanical keypad with touch panel function of the present invention.
Figure 6:
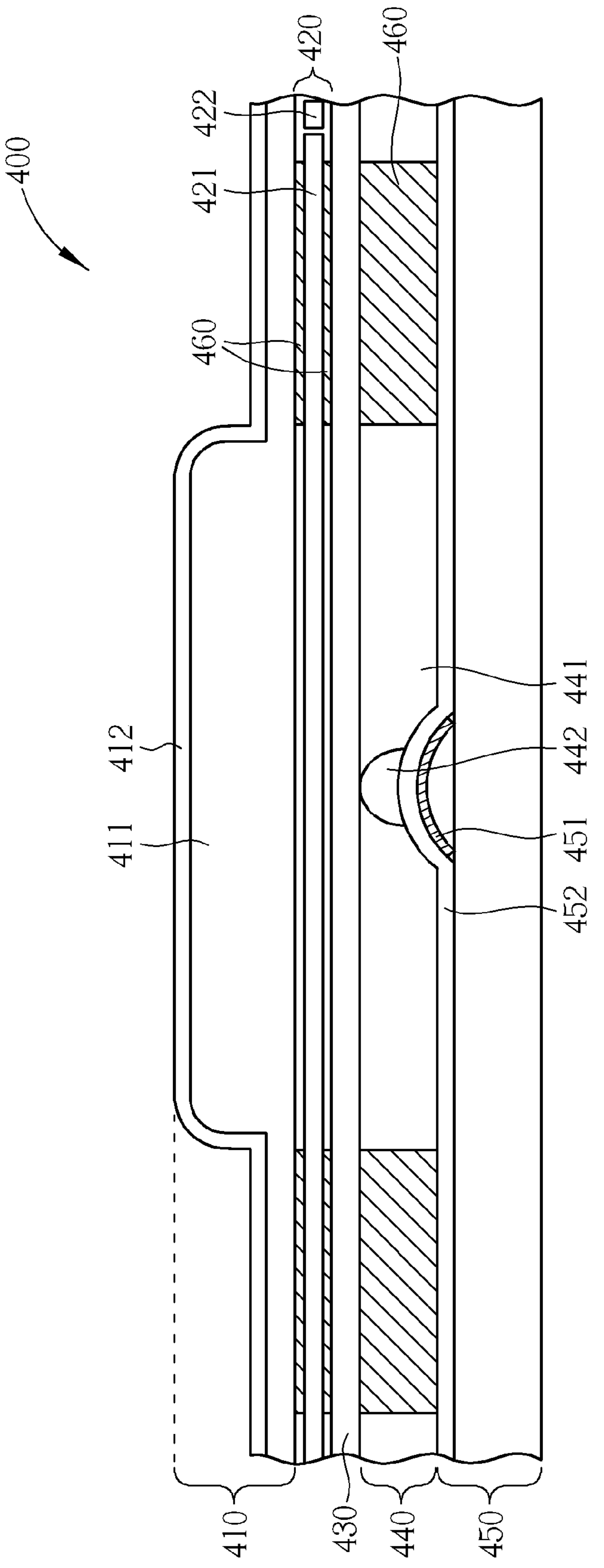
FIG. 6 illustrates a cross-sectional view along line C-C in FIG. 5.

In a third aspect of the present invention, still another mechanical keypad 400 with touch panel function is provided. Please refer to FIG. 5, illustrating a top view of a third embodiment of the mechanical keypad with touch panel function of the present invention. FIG. 6 illustrates a cross-sectional view along line C-C in FIG. 5. Please refer to FIG. 6, the mechanical keypad 400 with touch panel function of the present invention, a film-in-plastic (FIP) keypad for example, includes a key set 410, a backlight layer 420, a capacitive touch unit 430, an elastic layer 440, and a circuit board 450.

What is different from the second embodiment of the present invention is, in the third embodiment of the present invention the key set 410 includes a plurality of mutually connecting keycaps 411 and a keytop 412 which supports the mutually connecting keycaps 411. The mutually connecting keycaps 411 are usually made of polymers, such as polycarbonate or PET. There are some bulges in the keytop 412 to support the keycaps 411. The keytop 412 are usually made of a UV-curable resin or polyurethane. The specific print patterns (not shown), such as characters or letters, may be made by back printing to correspondingly mark the functions of each key.

The backlight layer 420 may include a light guide film 422 (LGF) and at least one LED 423. The elastic layer 440 may include an elastomer 441 and a plurality of plungers 442 which correspond to the multiple keycaps 411. The circuit board 450 includes a plurality of metal domes 451 which correspond to the multiple keycaps 411, as well as a plurality of dome sheets 452 which correspond to the metal domes 451. The function of the dome sheets 452 is useful for adhering the metal domes 451 and the circuit board 450. The dome sheets 452 are usually made of a polymer material, such as PET.

In the third embodiment of the present invention, an adhesive 460 or a duct tape may be used to respectively fix the layers, such as keycaps 411, the backlight layer 420 and the capacitive touch unit 430, the elastic layer 440 and the circuit board 450. One feature of the third embodiment of the mechanical keypad with touch panel function of the present invention resides in that the thickness of the mechanical keypad 400 with touch panel function may be relatively small. For example, the distance of the keytop 412 to the capacitive touch unit 430 may be less than 2 mm so that the capacitive touch unit 430 is more sensitive to the operations of users. Under the combination of the key mode and the touch mode, various type of input methods may be carried out, for example a dialing mode, a writing mode by means of a finger tip to write letters or Chinese characters, or a picture browsing mode to drag, choose, to enlarge or shrink a picture by finger tips. Other aspects of the third embodiment of the mechanical keypad with touch panel function of the present invention may refer to the above-mentioned second embodiment so the details will not be described here.

Those skilled in the art will readily observe that numerous modifications and alterations of the device and method may be made while retaining the teachings of the invention.

What is claimed is:

1. A mechanical keypad with touch panel function, comprising:

a key set comprising a plurality of keycaps and a keytop covering said keycaps;

a capacitive touch unit selectively disposed under several of said keycaps and comprising a plurality of openings to accommodate several said keycaps;

an elastic layer disposed under said capacitive touch unit and comprising an elastomer and a plurality of plungers corresponding to said keycaps;

a backlight layer comprising a plurality of openings to accommodate said several keycaps; and a circuit board disposed under said backlight layer and comprising a plurality of metal domes corresponding to said several keycaps as well as a plurality of dome sheets corresponding to said metal domes, wherein each said metal dome provides a mechanical feedback force so that said keycaps are capable of being in indirect contact with said metal domes and with said dome sheets by means of said plungers.

2. The mechanical keypad with touch panel function of claim 1, wherein said keytop is formed of any one of PC and PET.

3. The mechanical keypad with touch panel function of claim 1, wherein said keytop comprises a print pattern.

4. The mechanical keypad with touch panel function of claim 1, wherein said elastomer is formed of any one of silicon and rubber.

5. The mechanical keypad with touch panel function of claim 1, further comprising:

an adhesive for fixing said keytop and said capacitive touch unit.

6. The mechanical keypad with touch panel function of claim 1, wherein said backlight layer comprises a light guide film (LGF) and at least one LED, and said light guide film comprises a plurality of openings to accommodate said several keycaps.

7. The mechanical keypad with touch panel function of claim 6, wherein said light guide film is formed of any one of polyurethane, polycarbonate, silicon and polymethacrylate and PET.

8. A mechanical keypad with touch panel function, comprising:

a key set comprising a plurality of mutually connecting keycaps and a keytop covering said mutually connecting keycaps;

a backlight layer disposed under said key set;

a capacitive touch unit disposed under said backlight layer;

an elastic layer disposed under said capacitive touch unit and comprising an elastomer and a plurality of plungers corresponding to said keycaps; and a circuit board comprising a plurality of metal domes corresponding to said plungers as well as a plurality of dome sheets corresponding to said metal domes, wherein each said metal dome provides a mechanical feedback force so that said keycaps are capable of being in indirect contact with said metal domes and with said dome sheets by means of said plungers.

9. The mechanical keypad with touch panel function of claim 8, wherein said keytop is formed of any one of PC and PET.

10. The mechanical keypad with touch panel function of claim 8, wherein said keytop comprises a print pattern.

11. The mechanical keypad with touch panel function of claim 8, wherein said keycaps comprises a UV-curable resin.

12. The mechanical keypad with touch panel function of claim 8, wherein said backlight layer comprises a light guide film (LGF) and at least one LED.

13. The mechanical keypad with touch panel function of claim 12, wherein said light guide film is formed of any one of polyurethane, polycarbonate, silicon and polymethacrylate and PET.

14. The mechanical keypad with touch panel function of claim 8, wherein said elastomer is formed of any one of silicon and rubber.

15. The mechanical keypad with touch panel function of claim 9, further comprising:

an adhesive for fixing said keycaps, said backlight layer and said capacitive touch unit.

16. A mechanical keypad with touch panel function, comprising:

a key set comprising a plurality of mutually connecting keycaps and a keytop supporting said mutually connecting keycaps;

a backlight layer disposed under said key set;

a capacitive touch unit disposed under said backlight layer;

an elastic layer disposed under said capacitive touch unit and comprising an elastomer and a plurality of plungers corresponding to said keycaps; and a circuit board comprising a plurality of metal domes corresponding to said plungers as well as a plurality of dome sheets corresponding to said metal domes, wherein each said metal dome provides a mechanical feedback force so that said keycaps are capable of being in indirect contact with said metal domes and with said dome sheets by means of said plungers.

17. The mechanical keypad with touch panel function of claim 16, further comprising:

a keytop for covering said key set.

18. The mechanical keypad with touch panel function of claim 17, wherein said keytop comprises polycarbonate.

19. The mechanical keypad with touch panel function of claim 17, wherein said keytop comprises a print pattern.

20. The mechanical keypad with touch panel function of claim 16, wherein said keycaps comprise polyurethane.

21. The mechanical keypad with touch panel function of claim 16, wherein said backlight layer comprises a light guide film (LGF) and at least one LED.

22. The mechanical keypad with touch panel function of claim 16, wherein said light guide film is formed of any one of polyurethane, polycarbonate, silicon and polymethacrylate and PET.

23. The mechanical keypad with touch panel function of claim 16, wherein said elastomer is formed of any one of silicon and rubber.

24. The mechanical keypad with touch panel function of claim 16, further comprising:

an adhesive for fixing said keycaps, said backlight layer and said capacitive touch unit.

* * * * *